United States Patent
Dastidar et al.

(10) Patent No.: US 7,216,307 B1
(45) Date of Patent: May 8, 2007

(54) METHOD OF IDENTIFYING STATE NODES AT THE TRANSISTOR LEVEL IN A SEQUENTIAL DIGITAL CIRCUIT USING MINIMUM COMBINATORIAL FEEDBACK LOOP

(75) Inventors: Tathagato Rai Dastidar, Bangalore (IN); Amir Yashfe, Cupertino, CA (US); Partha Ray, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 10 days.

(21) Appl. No.: 11/167,523

(22) Filed: Jun. 27, 2005

(51) Int. Cl.
*G06F 17/50* (2006.01)

(52) U.S. Cl. ................... 716/1; 716/12; 716/6

(58) Field of Classification Search ............ 716/1, 716/6, 12
See application file for complete search history.

(56) References Cited

U.S. PATENT DOCUMENTS

2002/0175705 A1* 11/2002 Lowy et al. .................. 326/46

OTHER PUBLICATIONS

A. Salz and M.A. Horowitz, "IRSIM: An Incremental MOS Switch-Level Simulator", Proceedings of the Design Automation Conference, Jun. 1989, pp. 173-178.
Randal E. Bryant, "Extraction Of Gate Level Models From Transistor Circuits By Four-Valued Symbolic Analysis", International Conference on Computer-Aided Design (ICCAD '91), 1991, pp. 1-8.
J. Grodstein et al., "Automatic Detection Of MOS Synchronizers For Timing Verification", Computer-Aided Design, ICCAD-91, Digest of Technical Papers, IEEE International Conference on Nov. 11-14, 1991, pp. 304-307.
C. McDonald and R. Bryant, "Symbolic Functional And Timing Verification Of Transistor-Level Circuits", Computer-Aided Design, Digest of Technical Papers, IEEE/ACM International Conference on Nov. 7-11, 1999, pp. 526-530.

* cited by examiner

*Primary Examiner*—Thuan Do
(74) *Attorney, Agent, or Firm*—Mark C. Pickering

(57) ABSTRACT

The state nodes in a sequential digital circuit are identified by identifying the minimal combinatorial feedback loops that are present in the digital circuit. Each minimal combinatorial feedback loop has at least one driver node, and one driver node from each minimal combinatorial feedback loop is assigned to be the state node for the loop.

29 Claims, 3 Drawing Sheets

METHOD OF IDENTIFYING STATE NODES AT THE TRANSISTOR LEVEL IN A SEQUENTIAL DIGITAL CIRCUIT USING MINIMUM COMBINATORIAL FEEDBACK LOOP

BACKGROUND OF THE INVENTION

1. Field of the Invention

The present invention relates to state nodes and, more particularly, to a method of identifying state nodes at the transistor level in a sequential digital circuit.

2. Description of the Related Art

A state node in a sequential digital circuit represents a memory element. It has two stable states (logic 1 and logic 0), and can retain its value or memory until some other data is written on it. For example, the outputs of all of the flipflops in a sequential digital circuit are driven by state nodes. This is because a flipflop output retains its value until a clock pulse is applied to the flop. Structurally, a state node can be any node on a combinatorial feedback loop in a circuit.

DETAILED DESCRIPTION OF THE INVENTION

Figure 1:
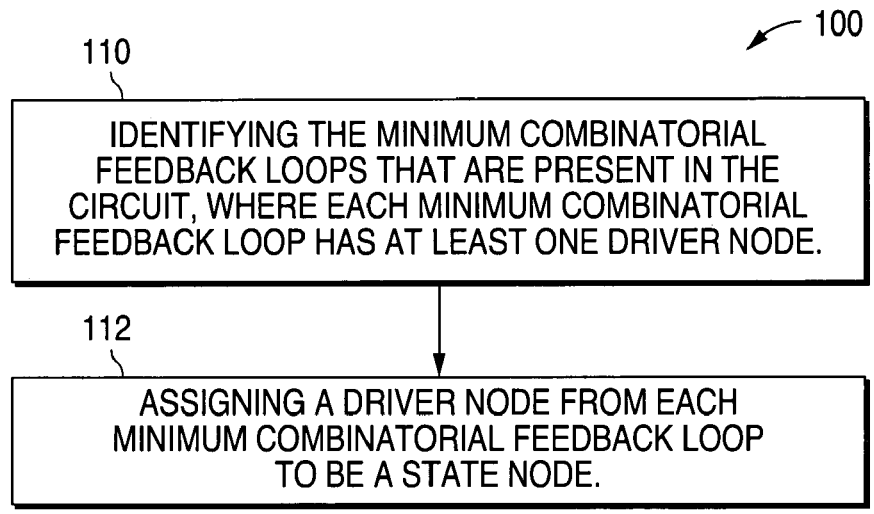
FIG. 1 is a flow chart illustrating an example of a method 100 of identifying the state nodes in a circuit in accordance with the present invention.

FIG. 1 shows a flow chart that illustrates an example of a method 100 of identifying the state nodes in a circuit in accordance with the present invention. As shown in FIG. 1, method 100 begins at step 110 by identifying the minimum combinatorial feedback loops that are present in the circuit.

Figure 2:
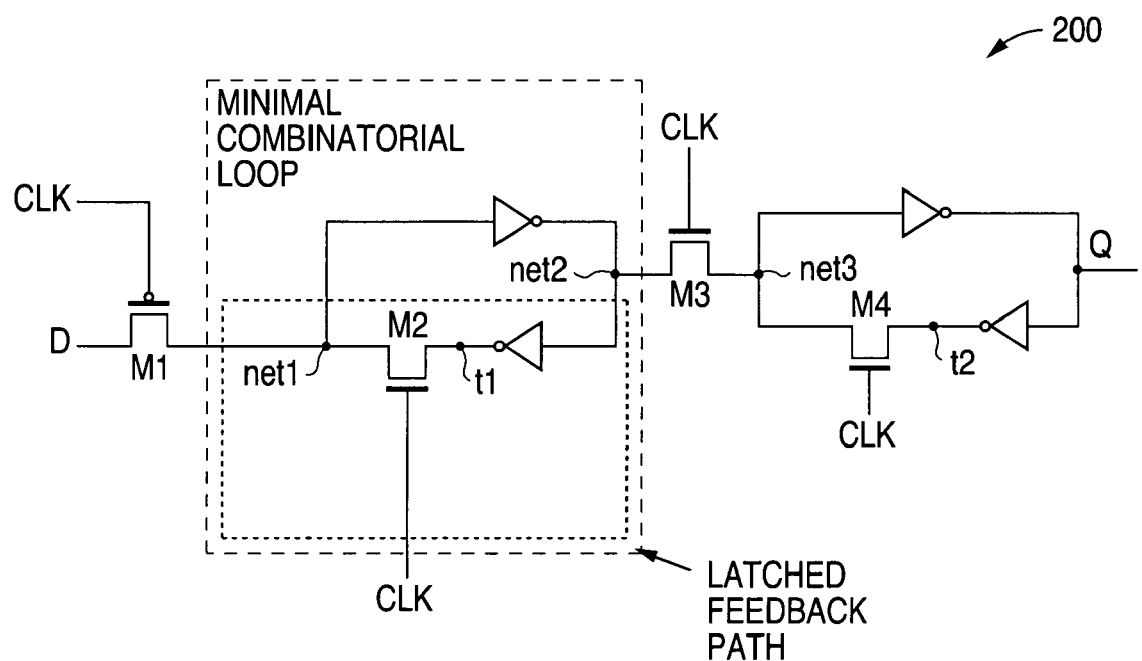
FIG. 2 is a schematic diagram illustrating an example of a circuit 200 with a combinatorial feedback loop in accordance with the present invention.

A combinatorial feedback loop is defined as a set of circuit nodes where there exists a combinatorial path from each node in the loop to all other nodes in the loop under some input combinations. FIG. 2 shows a schematic diagram that illustrates an example of a circuit 200 with a combinatorial feedback loop in accordance with the present invention.

As shown in the FIG. 2 example, circuit 200 includes two input nodes, a data node D and a clock node CLK, five internal nodes net1, net2, t1, net3, and t2, and one output node Q. The data node D, in turn, receives a data signal, while the clock node CLK receives a clock signal.

In addition, circuit 200 includes a PMOS transistor M1 that is connected to internal node net1 and the two input nodes D and CLK, and an NMOS transistor M2 that is connected to internal nodes net1 and t1 and the clock node CLK. Further, circuit 200 includes an NMOS transistor M3 that is connected to internal nodes net2 and net3 and the clock node CLK, and an NMOS transistor M4 that is connected to internal nodes net3 and t2 and the clock node CLK.

As further shown in FIG. 2, the set of internal and output circuit nodes net1, net2, t1, net3, t2, and Q form a combinatorial feedback loop because a combinatorial path exists from each circuit node to all of the remaining nodes when the clock signal CLK is high. All sequential circuits consist of some form of combinatorial feedback loops.

A minimum combinatorial feedback loop, in turn, is defined as a set of circuit nodes where there exists a combinatorial path from at least one node to all other nodes in the loop under all input combinations. In FIG. 2, the set of circuit nodes net1, net2, t1, net3, Q, and t2 do not form a minimum combinatorial feedback loop because there is no single circuit node which drives all of the other nodes under all valid input combinations.

On the other hand, the set of circuit nodes net1, net2, and t1 form a minimum combinatorial feedback loop because node net1 has a combinatorial path to nodes net2 and t1 under all input conditions. Similarly, nodes net3, Q, and t2 form a minimum combinatorial feedback loop because node net3 has a combinatorial path to nodes Q and t2 under all input conditions.

A circuit node which has a combinatorial path to all of the other nodes under all input conditions is known as a driver node. A minimum combinatorial feedback loop has at least one driver node, but can have more than one. Thus, in this example, nodes net1 and net3 are the driver nodes of the two loops.

Returning to FIG. 1, after the driver nodes in the minimum combinatorial feedback loops have been identified, method 100 moves to step 112 to assign a driver node from each minimum combinatorial feedback loop to be a state node. In this example, since each loop has only one driver node, nodes net1 and net3 are assigned to be the state nodes for the loops in step 112 of method 100.

In the present invention, it is assumed that all sequential logic blocks have one or more minimum combinatorial feedback loops, with each loop having one or more driver nodes. No assumption is made regarding the actual implementation of the loop or the latches. As a result, the present invention is independent of the circuit design methodology employed.

Figure 3:
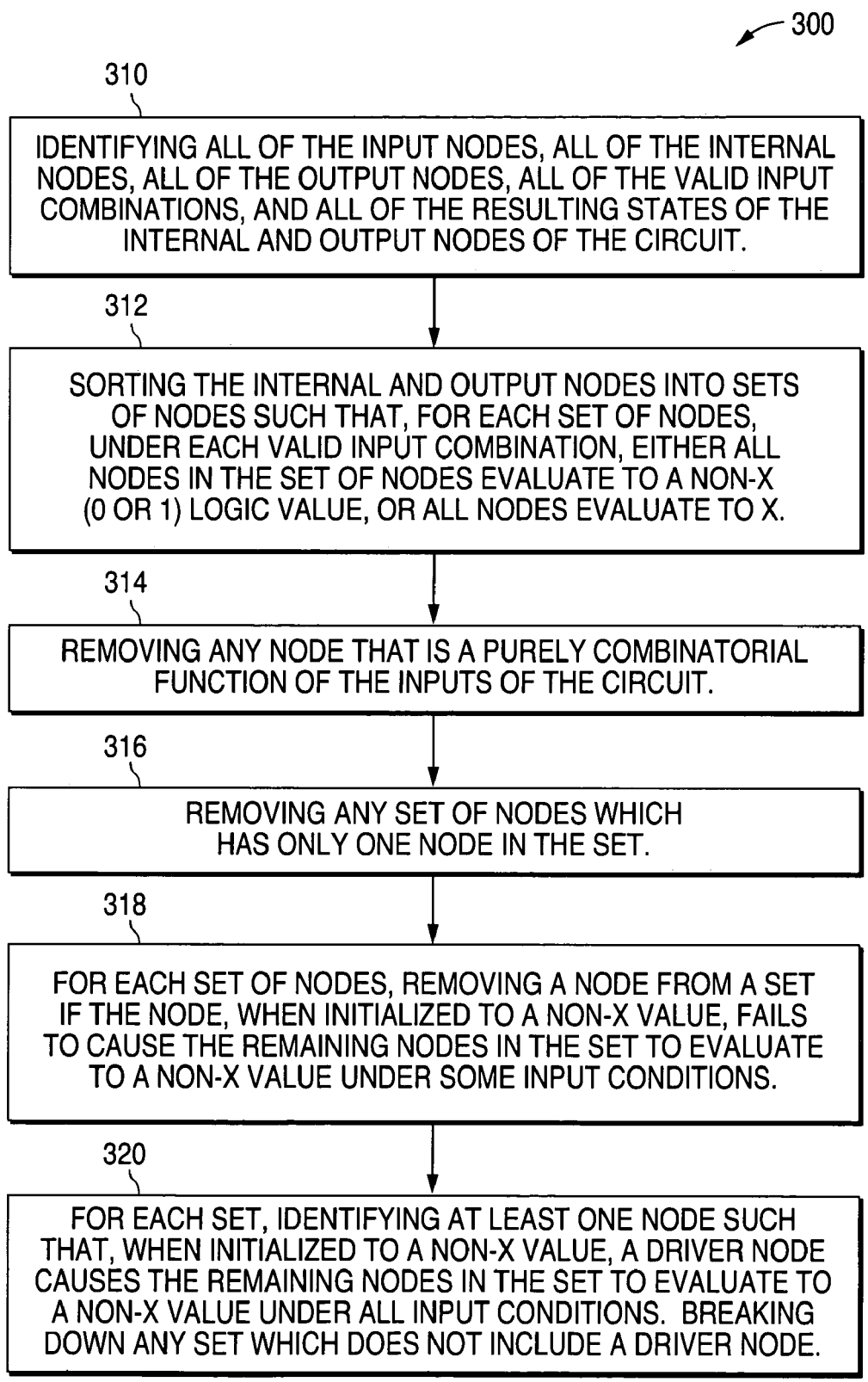
FIG. 3 is a flow chart illustrating an example of a method 300 of identifying the minimal combinatorial loops that are present in a sequential digital circuit in accordance with the present invention.

FIG. 3 shows a flow chart that illustrates an example of a method 300 of identifying the minimal combinatorial loops that are present in a sequential digital circuit in accordance with the present invention. Method 300 can be utilized, for example, to implement step 110 of method 100.

As shown in FIG. 3, method 300 begins at step 310 by identifying all of the input nodes, all of the internal nodes, and all of the output nodes of the circuit. In addition, method 300 also identifies in step 310 all of the valid input combinations to the input nodes of the circuit, and all of the resulting states of the internal and output nodes.

The information identified in step 310 for the circuit can be organized, for example, in a truth table. The truth table has a number of rows, and an orientation where each row lists a valid input combination, and the states of the internal and output nodes that result from the valid input combination.

For example, Table 1 below illustrates a truth table for circuit 200 of FIG. 2. As shown in Table 1, all of the input nodes D and CLK are identified, all of the internal nodes net1, net2, t1, net3, and t2 are identified, and all of the output nodes Q are identified. In addition, each row lists a valid input combination to the data and clock nodes D and CLK, and the states of the internal and output nodes net1, net2, t1, net3, t2, and Q that result from the valid input combination.

TABLE 1

| D | CLK | net1 | t1 | net2 | net3 | t2 | Q |
|---|-----|------|----|------|------|----|----|
| 0 | 0 | 0 | 0 | 1 | X | X | X |
| 0 | 1 | X | X | X | X | X | X |
| 1 | 0 | 1 | 1 | 0 | X | X | X |
| 1 | 1 | X | X | X | X | X | X |

For example, with respect to the first row of Table 1, when both the data signal D and the clock signal CLK are low, PMOS transistor M1 turns on, driving node net1 to have the logic state of the data signal D, a logic low in this example. This drives node net2 to have a logic high, and node t1 to have a logic low. Nodes net3, t2, and Q, however, are undefined (X represents an unknown state) because NMOS transistor M3 is turned off when the clock signal CLK is low.

After the information has been identified, method 300 moves to step 312 to sort the internal and output nodes into sets of circuit nodes so that under each valid input combination, either all nodes in a set of nodes evaluate to a non-X (0 or 1) logic value, or all nodes evaluate to X.

This is a necessary condition for a combinatorial loop which is not directly driven by the inputs through a combinatorial path. It is also a necessary (but not sufficient) condition for all nodes to be part of the same combinational loop since they all must be either X or must all have a non-X value.

The sets of circuit nodes can be sorted, for example, by identifying columns in the truth table that match such that in each row of a set of matching columns, each column has either a non-X value or an X value. Columns i and j are said to match if and only if for all rows k, either table (k,i)=table (k,j)=X, or both table (k,i) and table (k,j) have a non-X value. Also, table (k,i)=X for some k.

For example, as shown in the first row of Table 1, nodes net1, t1, and net2 each have a non-X value under the first input combination and, as shown in the second row of Table 1, each have an X value under the second input combination. Similarly, as shown in the third row of Table 1, nodes net1, t1, and net2 each have a non-X value under the third input combination and, as shown in the fourth row of Table 1, each have an X value under the fourth input combination. As a result, the columns for nodes net1, t1, and net2 match. Thus, the sort forms a first set of circuit nodes that includes nodes net1, t1, and net2.

Similarly, as shown in Table 1, nodes net3, t2, and Q each have an X value under all four of the input combinations. As a result, the columns for nodes net3, t2, and Q match. Thus, the sort also forms a second set of circuit nodes that includes nodes net3, t2, and Q. Therefore, in the Table 1 example, the sort forms two sets of circuit nodes: nodes net1, net2, and t1; and nodes net3, t2, and Q.

Following this, method 300 moves to step 314 to remove any circuit node from a set that is a purely combinational function of the inputs. If a node is a purely combinational function of the inputs, then the values are uniquely determined by the inputs. When values are uniquely determined by the inputs, no state node can be present.

For example, consider an n-input and an m-output circuit. Using a simulator, all of the internal nodes and the outputs of a circuit can be initialized to an X logic state. Starting from this state (with all nodes set to X), the circuit has no state nodes if a logic value other than X is obtained at all outputs under all valid input combinations.

This is because, if all outputs evaluate to a non-X state for all valid input combinations, then the circuit is purely combinatorial, i.e., the output state is uniquely identified by the input combination. If, the outputs evaluate to X under some or all valid input combinations then the circuit may have state nodes.

The phrase "valid input combination" is defined to mean an input combination which does not violate any functional relationships between different inputs, if such relationship exists. For example, if one input is guaranteed to be the complement of another input, a combination where both inputs are assigned the same value is not a valid input combination.

After this, method 300 moves to step 316 to discard any set of circuit nodes which has only one member in the set. Thus, each set of circuit nodes must have more than one circuit node. Each set must consist of multiple circuit nodes since a minimal combinatorial loop must have at least two circuit nodes.

When sets of circuit nodes have been formed (such as nodes net1, t1, and net2; and nodes net3, t2, and Q), method 300 moves to step 318 where, for each set, method 300 removes a node from the set if the node, when initialized to a non-X value, fails to cause the remaining nodes in the set to evaluate to a non-X value under some input conditions.

In other words, one of the circuit nodes in the set is selected to be a test node, the test node is initialized to have a non-X value, and the circuit is simulated with a valid input combination. (Circuit 200 has four valid input combinations.) If all of the remaining nodes in the set evaluate to a non-X value, then the test node is retained in the set, and another node from the set is selected to be the test node.

On the other hand, if any of the remaining nodes in the set evaluate to a value of X, then the test node is simulated with another valid input combination. The process continues until an input combination causes all of the remaining nodes to evaluate to a non-X value, or all of the input combinations have been tried.

When no input combination produces a non-X value, the test node is removed from the set and placed into a removed node set. After this, another node in the set is selected to be the test node. The process is repeated until all of the circuit nodes in the set have been tested as described. (The procedure is also applied to the nodes placed into the removed node set after all of the sets have been tested. Nodes which are removed from the removed node set are discarded.)

For example, consider the set of nodes net3, t2, and Q of circuit 200 shown in FIG. 2. If node net3 is initialized to a value of 0 or 1, and the circuit is simulated, nodes t2 and Q evaluate to a non-X value (0 or 1). Initializing node Q or t2 to a value of 0 or 1 causes node net3 to evaluate to a non-X value when the clock signal on the clock node CLK is high (which turns on transistor M4).

The evaluation in step 314 ensures that all nodes in a set of circuit nodes are combinatorially driven by each other under some input combinations, which is a unique property of a loop. Nodes which become X under some input combinations but are not part of any loop are not included in the set, since they will not be driving or be driven by other nodes in the loop. The evaluation in step 314 identifies the combinatorial feedback loops in a circuit, but it is insufficient to identify the minimum combinatorial feedback loops in the circuit.

After this, method 300 moves to step 320 where, for each set, method 300 identifies at least one driver node such that, when initialized to a non-X value, the driver node causes the remaining nodes in the set to evaluate to a non-X value under all input conditions. In other words, one of the circuit nodes in the set is selected to be a test node, the test node is initialized to have a non-X value, and the circuit is simulated with all valid input combinations.

If all of the remaining nodes in the set evaluate to a non-X value under all (four) input combinations, then the test node is retained in the set as a driver node, and another node in the set is selected to be the test node. On the other hand, if any of the remaining nodes in the set evaluate to a value of X under any of the input combinations, then the test node is marked as a non-driver node. After this, another node in the set is selected to be the test node. The process is repeated until all of the nodes in the set have been tested as described. (The procedure is also applied to any nodes remaining in the removed node set.)

Thus, step 320 verifies that each set has one or more driver nodes, and identifies all of the driver nodes in a set. If no driver node exists within a set, the set is broken down into smaller sets. This process continues until at least one driver node has been identified in every remaining set, or the sets are otherwise eliminated.

Figure 4:
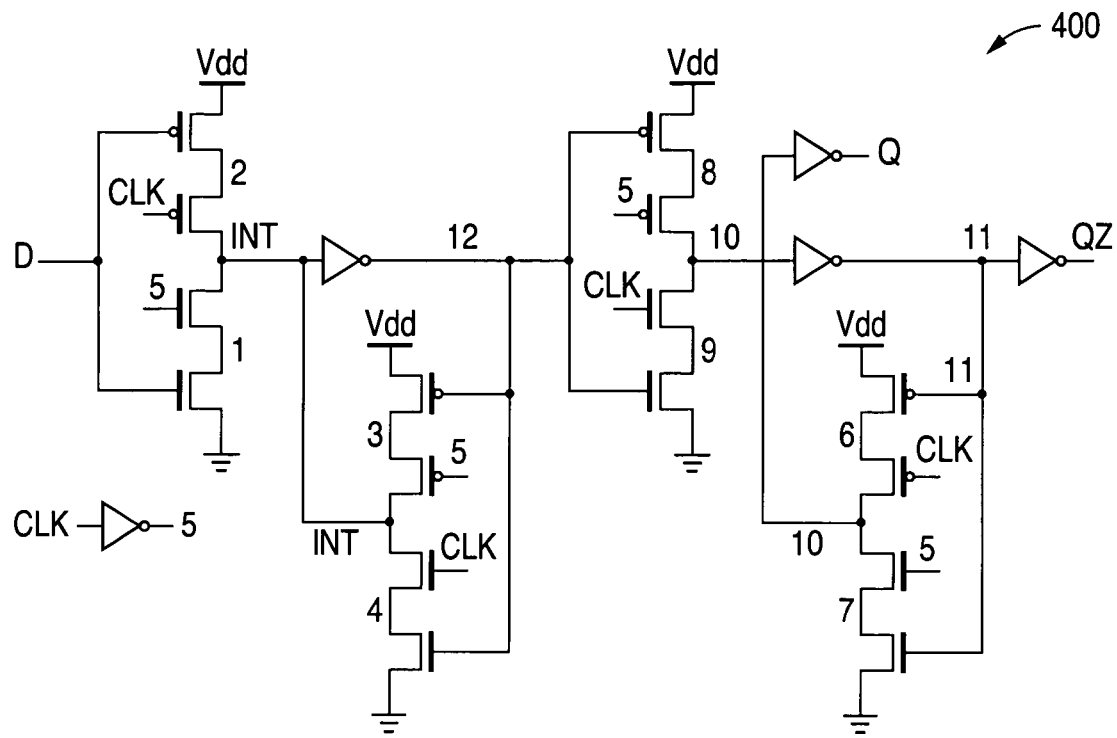
FIG. 4 is a schematic diagram illustrating an example of a D flipflop 400 in accordance with the present invention.

FIG. 4 shows a schematic diagram that illustrates an example of D flipflop 400 in accordance with the present invention. As an example of the present invention, method 300 is applied to flipflop 400. Applying method 300 to flipflop 400 begins with step 310 by identifying all of the input nodes, all of the internal nodes, and all of the output nodes of the circuit. In addition, all of the valid input combinations to the circuit and all of the resulting states of the internal and output nodes are identified.

As shown in FIG. 4, flipflop 400 has two input nodes: a data input D and a clock input CLK; 13 internal nodes INT, 1, 2, 3, 4, 5, 6, 7, 8, 9, 10, 11, and 12; and two output nodes Q and QZ. The identified information for the circuit can be organized in a truth table. For example, Table 2 below illustrates a truth table for circuit 400 of FIG. 4.

TABLE 2

| D | CLK | INT | 1 | 2 | 3 | 4 | 5 | 6 | 7 | 8 | 9 | 10 | 11 | 12 | Q | QZ |
|---|-----|-----|---|---|---|---|---|---|---|---|---|----|----|----|---|----|
| 0 | 0 | 1 | 1 | 1 | 1 | Z | 1 | X | X | 1 | Z | X | X | 0 | X | X |
| 0 | 1 | X | Z | 1 | X | X | 0 | X | X | X | X | X | X | X | X | X |
| 1 | 0 | 0 | 0 | 0 | Z | 0 | 1 | X | X | Z | 0 | X | X | 1 | X | X |
| 1 | 1 | X | 0 | Z | X | X | 0 | X | X | X | X | X | X | X | X | X |

Following this, in step 312, the internal and output nodes are sorted into sets of circuit nodes so that under each valid input combination, either all nodes in a set of nodes evaluate to a non-X (0 or 1) logic value, or all nodes evaluate to X.

For example, if node INT is selected as a base member of a set, then nodes INT, 1, 2, 3, 5, 8, and 12 are initially sorted into a set since each node has a non-X value in response to the first input combination. Nodes 1, 2, and 5 are then removed from the set, leaving nodes INT, 3, 8, and 12, since nodes 1, 2, and 5 differ from node INT in response to the second input condition.

Further, nodes 3 and 8 are removed from the set, leaving nodes INT and 12, since nodes 3 and 8 differ from node INT in response to the third input condition. Nodes INT and 12 both remain in the set as both nodes have the same response to the fourth input condition. Thus, the first set formed by the sort includes nodes INT and 12.

Following this, another node, other than nodes already in a set, is selected as the base member of a set, and the process is repeated until every circuit node belongs to a set. The sets of circuit nodes identified from Table 2 include {INT, 12}, {1}, {2}, {3, 8}, {4, 9}, {5}, and {6, 7, 10, 11, Q, QZ}.

After this, in step 314, set {5} is removed by the sort because circuit node 5 has a non-X value associated with each row of valid input combinations and is, therefore, a purely combinational function of the inputs. Next, in step 316, sets {1} and {2} are removed by the sort because these sets have only one member. Thus, the sets formed by the sort include {INT, 12}, {3, 8}, {4, 9}, and {6, 7, 10, 11, Q, QZ}.

In step 318, for each set of nodes, method 300 removes a node from a set if the node, when initialized to a non-X value, fails to cause the remaining nodes in the set to evaluate to a non-X value under some input combinations. For example, with respect to the set {6, 7, 10, 11, Q, QZ}, when node 10 is initialized to a non-X value, the value drives all of the other nodes in the set to a non-X value under some input conditions. This is also true for node 11. However, initializing nodes 6, 7, Q, or QZ to a non-X value does not drive the other nodes to a non-X value under any input combination. As a result, these nodes are deleted from the set. Thus, after step 318, the remaining sets are {INT, 12}, {3, 8}, {4, 9}, and {10, 11}.

Following this, in step 320, for each set of nodes, method 300 identifies at least one driver node such that, when initialized to a non-X value, the driver node causes the remaining nodes in the set to evaluate to a non-X value under all input combinations. As shown in FIG. 4, nodes INT and 10 cause the remaining nodes in the respective sets to evaluate to non-X values under all input conditions, and are therefore marked as driver nodes. However, nodes 12 and 11 do not cause nodes INT and 10, respectively, to evaluate to a non-X value under all input combinations. As a result, nodes 12 and 11 are marked as non-driver nodes.

If a set does not include any driver nodes, the set is broken down into smaller sets. For example, set {3, 8} includes no driver nodes. As shown in FIG. 4, with set {3, 8}, when node 3 or node 8 is initialized to a non-X value, there is no input combination which causes node 8 or node 3, respectively, to have a non-X value.

In the set {3, 8} example, a value is assigned to node 3 under all valid input combinations, and the responses are observed at node 8. The result is shown below in Table 3, which indicates that assigning a value of zero to node 3 does not result in node 8 evaluating to a value of 0 or 1 under all input combinations.

TABLE 3

| D | CLK | Node 3 | Node 8 |
|---|-----|--------|--------|
| 0 | 0 | 0 | 1 |
| 0 | 1 | 0 | X |
| 1 | 0 | 0 | Z |
| 1 | 1 | 0 | X |

(Z represents a high impedance state.)

Following this, a value is assigned to node 8 under all valid input combinations, and the responses are observed at node 3. The result is shown below in Table 4, which indicates that assigning a value of zero to node 8 does not result in node 3 evaluating to a value of 0 or 1 under all input combinations.

TABLE 4

| D | CLK | Node 8 | Node 3 |
|---|---|---|---|
| 0 | 0 | 0 | 1 |
| 0 | 1 | 0 | X |
| 1 | 0 | 0 | Z |
| 1 | 1 | 0 | X |

From Tables 3 and 4, it can be seen that assigning a value to a node in the set {3, 8} results in the other node evaluating to a 0 or 1 logic value under only some input combinations. As a result, step 320 breaks set {3, 8} into set {3} and set {8}, and then eliminates both of these sets as having only one member. In addition, set {4, 9} is eliminated for the same reasons.

Thus, only sets {INT, 12} and {10, 11} include driver nodes, with nodes INT and 10 being the only driver nodes. In the present invention, the state nodes are selected from the driver nodes in the sets. Thus, since only one driver node is present in each set, method 300 identifies nodes INT and 10 as the state nodes of flipflop 400.

Figure 5:
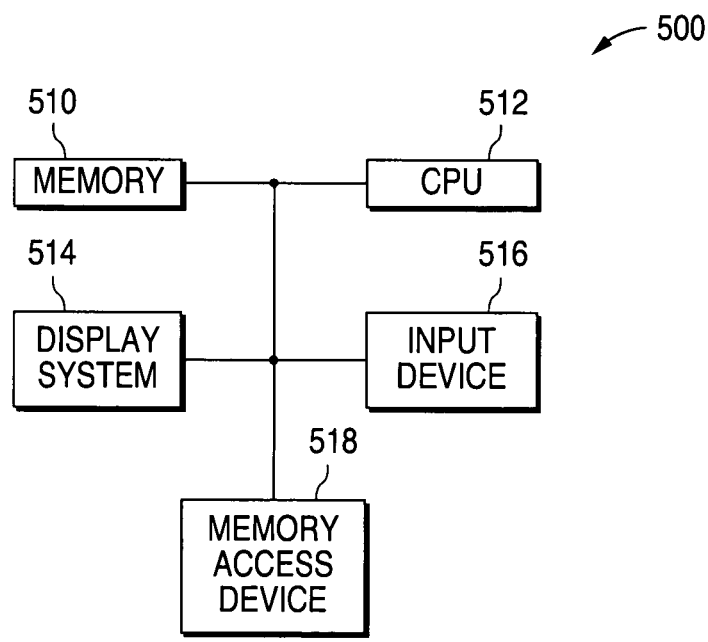
FIG. 5 is a block diagram illustrating an example of a computer 500 in accordance with the present invention.

FIG. 5 shows a block diagram that illustrates an example of a computer 500 in accordance with the present invention. Computer 500, which can be implemented with, for example, a Pentium4 3.4 GHz or comparable machine, can be used to execute a sequence of instructions that implements all or portions of methods 100 and 300 of the present invention.

As shown in FIG. 5, computer 500 includes a memory 510 and a central processing unit (CPU) 512 that is connected to memory 510. Memory 510 stores data, an operating system, and a set of program instructions. The operating system can be implemented with, for example, the Linux operating system, although other operating systems can alternately be used.

The program instructions can be written in, for example, C++ although other languages can alternately be used. For example, the program instructions can be implemented as a modified version of the program instructions used to implement a device level digital simulator, such as IRSIM, ESIM, RSIM, and RNL. IRSIM is a public domain tool supported by the University of California at Berkeley.

CPU 512, which can be implemented with, for example, a 32-bit processor, operates on the data in response to the program instructions. Although only one processor is described, the present invention can be implemented with multiple processors in parallel to increase the capacity to process large amounts of data.

In addition, computer 500 can include a display system 514 that is connected to CPU 512. Display system 514, which can be remotely located, allows images to be displayed to the user which are necessary for the user to interact with the program. Computer 500 also includes a user-input system 516 which is connected to CPU 512. Input system 516, which can be remotely located, allows the user to interact with the program.

Further, computer 500 includes a memory access device 518, such as a disk drive or a networking card, which is connected to memory 510 and CPU 512. Memory access device 518 allows the processed data from memory 510 or CPU 512 to be transferred to a computer-readable medium or a networked computer. In addition, device 518 allows the program instructions to be transferred to memory 510 from the computer-readable medium or networked computer.

In an alternative embodiment, hardware circuitry may be used in place of or in combination with software instructions to implement an embodiment of the present invention. As a result, the present invention is not limited to any specific combination of hardware circuitry and software.

Thus, the present invention provides a method of identifying state nodes in a sequential digital circuit at the transistor level. The method does not require any assumption about the structure of the circuit being tested. Specifically, the method does not use pattern matching techniques to identify latches, feedback loops, and similar circuits. Hence, the method is independent of the circuit design method, and works for all variety of circuits.

In the present invention, internally, the user identifies each of the circuit nodes. Externally, the user identifies the inputs, outputs, power supply, and ground pins of the circuit, but does not specify the nature of the input pins. For example, in a flipflop circuit, the user need not specifically identify the data input, clock or set/reset pins as the present method works independently of this.

One industrial application of the present invention is in the identification of synchronization points to perform a static timing analysis. For example, the state nodes identified by the present invention can be utilized as an alternate method to identify the synchronization points described by Grodstein et al., "Automatic Detection of MOS Synchronizers for Timing Verification," IEEE/ACM International Conference on Computer-Aided Design, ICCAD-91, Nov. 11–14, 1991, Santa Clara, Calif., USA, Digest of Technical Papers, pages 304–307. IEEE Computer Society, 1991, ISBN 0-8186-2157-5.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of identifying a number of state nodes in a circuit, the circuit having a number of inputs, the method comprising:

identifying a number of minimum combinatorial feedback loops that are present in the circuit, each minimum combinatorial feedback loop having at least one driver node; and assigning a driver node from each minimum combinatorial feedback loop to be a state node.

2. The method of claim 1 wherein the circuit has a number of input nodes, a number of internal nodes, and a number of output nodes.

3. A method of identifying a number of state nodes in a circuit, the circuit having a number of input nodes, a number of internal nodes, and a number of output nodes, and receiving a number of input combinations on the input nodes, the method comprising:

identifying a number of minimum combinatorial feedback loops that are present in the circuit, each minimum combinatorial feedback loop having at least one driver node, the identifying including sorting the internal and output nodes into sets of nodes such that, for each set of nodes, under each input combination, either all nodes evaluate to a non-X logic value, or all nodes evaluate to X; and assigning a driver node from each minimum combinatorial feedback loop to be a state node.

4. The method of claim 3 wherein identifying a number of minimum combinatorial feedback loops further includes, for each set of nodes, removing any node that is a purely combinational function of logic states on the inputs input nodes of the circuit.

5. The method of claim 4 wherein identifying step further includes removing any set of nodes which has only one node in the set.

6. The method of claim 5 wherein identifying further includes, for each set of nodes, removing a node from a set if the node, when initialized to a non-X value, fails to cause the remaining nodes in the set to evaluate to a non-X value under some input conditions.

7. The method of claim 6 wherein identifying further includes, for each set, identifying at least one driver node such that, when initialized to a non-X value, a driver node causes the remaining nodes in the set to evaluate to a non-X value under all input conditions.

8. The method of claim 7 wherein assigning assigns a driver node from each set to be a state node of the circuit.

9. A method of identifying a number of state nodes in a circuit, the circuit having a number of input nodes, a number of internal nodes, and a number of output nodes, and receiving a number of input combinations on the input nodes, the method comprising:

identifying a number of minimum combinatorial feedback loops that are present in the circuit, each minimum combinatorial feedback loop having at least one driver node, the identifying forming a truth table for the circuit, the truth table having a number of rows, and an orientation where each row lists one of the input combinations, and the plurality a number of resulting states of the internal and output nodes that result from said one of the input combinations; and assigning a driver node from each minimum combinatorial feedback loop to be a state node.

10. The method of claim 9 wherein identifying further includes sorting nodes together into sets by identifying columns in the truth table that match such that in each row of a set of matching columns, each column has either a non-X value or an X value.

11. The method of claim 10 wherein identifying further includes, for each set of nodes, removing any node that has a non-X value associated with each row of the truth table.

12. The method of claim 11 wherein identifying further includes removing any set of nodes which has only one node in the set.

13. The method of claim 12 wherein identifying further includes, for each set of nodes, removing a node from a set if the node, when initialized to a non-X value, fails to cause the remaining nodes in the set to evaluate to a non-X value under some input conditions.

14. The method of claim 13 wherein identifying further includes, for each set, identifying at least one driver node such that, when initialized to a non-X value, the driver node causes the remaining nodes in the set to evaluate to a non-X value under all input conditions.

15. The method of claim 14 wherein assigning assigns a driver node from each set to be a state node of the circuit.

16. A machine-readable medium having stored thereon sequences of instructions, the sequences of instructions including instructions which, when executed by a processor, causes the processor to perform:

identifying a number of minimum combinatorial feedback loops that are present in a circuit, each minimum combinatorial feedback loop having at least one driver node; and assigning a driver node from each minimum combinatorial feedback loop to be a state node.

17. The machine-readable medium of claim 16, wherein the circuit has a number of input nodes, a number of internal nodes, and a number of output nodes.

18. A machine-readable medium having stored thereon sequences of instructions, the sequences of instructions including instructions which, when executed by a processor, causes the processor to perform:

identifying a number of minimum combinatorial feedback loops that are present in a circuit, the circuit having a number of input nodes, a number of internal nodes, and a number of output nodes, and receiving a number of input combinations on the input nodes, each minimum combinatorial feedback loop having at least one driver node, the identifying, when executed by the processor, causes the processor to sort the internal and output nodes into sets of nodes such that, for each set of nodes, under each input combination, either all nodes evaluate to a non-X logic value, or all nodes evaluate to X; and assigning a driver node from each minimum combinatorial feedback loop to be a state node.

19. The machine-readable medium of claim 18, wherein identifying, when executed by the processor, causes the processor to, for each set of nodes, remove any node that is a purely combinational function of logic states on the input nodes of the circuit.

20. The machine-readable medium of claim 19, wherein identifying, when executed by the processor, causes the processor to remove any set of nodes which has only one node in the set.

21. The machine-readable medium of claim 20 wherein identifying, when executed by the processor, causes the processor to, for each set of nodes, remove a node from a set if the node, when initialized to a non-X value, fails to cause the remaining nodes in the set to evaluate to a non-X value under some input conditions.

22. The machine-readable medium of claim 21 wherein identifying, when executed by the processor, causes the processor to, for each set, identify at least one driver node such that, when initialized to a non-X value, the driver node causes the remaining nodes in the set to evaluate to a non-X value under all input conditions.

23. The machine-readable medium of claim 22 wherein assigning, when executed by the processor, causes the processor to assign a driver node from each set to be a state node of the circuit.

24. A method of identifying state nodes in a circuit, the circuit having two or more input nodes, one or more internal nodes, and one or more output nodes, the input nodes to receive a number of different logic state combinations, the method comprising:

for each logic state combination, determining a logic value for each internal node and each output node that results from applying a logic state combination to the input nodes; and forming a number of node sets, for each logic state combination, each member of a node set having a logic value of a same logic type, a first logic type including all non-X logic values, a second logic type including an X logic value.

25. The method of claim 24 and further including, for each node set, removing each node that is a purely combinational function of logic states placed on the input nodes of the circuit.

26. The method of claim 24 and further including removing any node set which has only one node in the set.

27. The method of claim 24 and further comprising, for each node set, removing a node from a set if the node, when initialized to a non-X value, fails to cause the remaining nodes in the set to evaluate to a non-X value under some input conditions.

28. The method of claim 24 and further comprising, for each node set, identifying at least one driver node such that, when initialized to a non-X value, a driver node causes the remaining nodes in the set to evaluate to a non-X value under all input conditions.

29. The method of claim 24 and further comprising assigning a driver node from each node set to be a state node of the circuit.

* * * * *

UNITED STATES PATENT AND TRADEMARK OFFICE
CERTIFICATE OF CORRECTION

| | | |
|---|---|---|
| PATENT NO. | : 7,216,307 B1 | Page 1 of 1 |
| APPLICATION NO. | : 11/167523 | |
| DATED | : May 8, 2007 | |
| INVENTOR(S) | : Dastidar et al. | |

It is certified that error appears in the above-identified patent and that said Letters Patent is hereby corrected as shown below:

Column 9,

Line 9, delete "inputs".

Line 11, delete "step".

Line 37, delete "the plurality".

Column 10,

Line 54, cancel the text beginning with "24. A Method of" to and ending "of the circuit." in Colum 12, Line 8.

Signed and Sealed this

Third Day of July, 2007

JON W. DUDAS
*Director of the United States Patent and Trademark Office*